United States Patent
Sasaki et al.

(10) Patent No.: US 7,666,770 B2
(45) Date of Patent: Feb. 23, 2010

(54) METHOD OF CONTROLLING IMPURITY DOPING AND IMPURITY DOPING APPARATUS

(75) Inventors: Yuichiro Sasaki, Tokyo (JP); Ichiro Nakayama, Osaka (JP); Tomohiro Okumura, Osaka (JP); Satoshi Maeshima, Hyogo (JP)

(73) Assignee: Panasonic Corporation, Osaka (JP)

( * ) Notice: Subject to any disclaimer, the term of this patent is extended or adjusted under 35 U.S.C. 154(b) by 765 days.

(21) Appl. No.: 10/570,787

(22) PCT Filed: Sep. 6, 2004

(86) PCT No.: PCT/JP2004/013260

§ 371 (c)(1),
(2), (4) Date: Mar. 6, 2006

(87) PCT Pub. No.: WO2005/027208

PCT Pub. Date: Mar. 24, 2005

(65) Prior Publication Data

US 2007/0059848 A1    Mar. 15, 2007

(30) Foreign Application Priority Data

Sep. 12, 2003   (JP) .............................. 2003-321385

(51) Int. Cl.
*H01L 21/42*   (2006.01)
(52) U.S. Cl. .............................. 438/513; 438/5; 438/14; 438/510; 257/E21.525
(58) Field of Classification Search .................... 438/5, 438/14, 510, 513; 257/E21.525
See application file for complete search history.

(56) References Cited

U.S. PATENT DOCUMENTS

| 6,020,592 | A | 2/2000 | Liebert et al. |
| 6,514,838 | B2* | 2/2003 | Chan .......................... 438/513 |
| 2004/0107909 | A1* | 6/2004 | Collins et al. ......... 118/723.001 |

FOREIGN PATENT DOCUMENTS

| JP | 6-37030 | 2/1994 |
| JP | 2000-114198 | 4/2000 |
| JP | 2000-332252 | 11/2000 |

OTHER PUBLICATIONS

Steve Walther et al., "Implant Dosimetry Results for Plasma Doping", 2000 IEEE, pp. 492-495.

* cited by examiner

*Primary Examiner*—Zandra Smith
*Assistant Examiner*—Christy L Novacek
(74) *Attorney, Agent, or Firm*—Wenderoth, Lind & Ponack, L.L.P.

(57) ABSTRACT

A method is provided for controlling a dose amount of dopant to be doped into an object to be processed in plasma doping. According to the method, the doping control is formed of the following processes: determining the temperature of the object, the amount of ions having dopant in plasma that collide with the object, and types of gases in plasma during doping; calculating a dose amount by neutral gas according to the temperature of the object, and a dose amount by ions from the determined amount of ions containing dopant that collide with the object; and carrying out doping so that the sum of the dose amount by neutral gas and the dose amount by ions equal to a predetermined dose amount.

25 Claims, 2 Drawing Sheets

METHOD OF CONTROLLING IMPURITY DOPING AND IMPURITY DOPING APPARATUS

TECHNICAL FIELD

The present invention relates to a method of controlling plasma doping employed in manufacturing a semiconductor, an LCD panel, and the like, and also relates to an impurity doping apparatus.

BACKGROUND ART

Conventionally, ion implantation has been widely used as a method of doping impurities used in manufacturing a semiconductor device. As a recent promising technology, attention is now focused on plasma-doping suitable for forming a shallow junction. Plasma-doping is a technique in which a surface of an object to be processed, for example, a semiconductor substrate, undergoes irradiation of plasma containing impurities, i.e., dopant so that dopant is doped therein.

In ion implantation, through a mass segregation process, an ion to be doped is extracted from plasma containing dopant and accelerated before being doped into an object to be processed. On the other hand, in plasma-doping, an object to be processed undergoes direct irradiation of plasma containing dopant so that the dopant is doped into relatively shallow surface regions. In this case, the plasma contains compound gases having dopant, ions and radicals of the compound, and ions and radicals of isolated dopant. When neutral gas having no dopant is added to plasma, the plasma further contains ions and radicals of the neutral gas.

In ion implantation, an intended dopant is ionized in advance, and therefore the dopant is directly measured with a Faraday cup as the amount of the ion. An amount of dopant to be added has been controlled according to the ion amount. In plasma-doping, on the other hand, it is thought that not only ions of a compound containing dopant but also the radicals are doped as dopant into the surface of an object to be processed. Radical, which is often translated into free radical, means an atom or molecule having at least one unpaired electron. Generally, such a state is very active and therefore easily causes reaction. Plasma contains gases including compounds of dopant in various forms: ions, radicals, and neutral gas. Therefore, in plasma-doping, the amount of dopant depends on doping conditions under which the dopant is doped from plasma into an object to be processed. To control the amount of dopant, many methods have been developed. As a typically used controlling method, ions that collide with the object to be processed are measured during plasma-doping as an amount of electric charge and by which the amount of dopant is controlled. As a measurement tool, a Faraday cup, which is capable of measuring the quantity of ions that collide with the object, is often used. For example, U.S. Pat. No. 6,020,592 and Reference 1 (Proc. 2000 Int. Conf. on Ion Implant. Tech., Alpbach, Austria, 17-22 Sep. 2000) disclose a method of measuring an amount of impurities, i.e., dopant while plasma-doping is being carried out. The measurement in the method employs an advanced Faraday cup. According to the method, a dose amount is determined on measurement of the amount of electric charge of ions that moved from plasma to a semiconductor wafer as the object to be processed. Specifically, a Faraday cup is disposed adjacent to the semiconductor wafer to measure the amount of ions. Real-time feedback of a current value measured by the Faraday cup controls the amount of dopant to be doped into the semiconductor wafer.

When the plasma doping is used in a manufacturing process of a semiconductor device, measurement of the amount of ions by a Faraday cup during the plasma doping controls the dose amount, and at the same time, the crystalline state of the object is monitored by in-situ observation with the use of surface optical absorption measurement or an ellipsometer.

The conventional dose-amount control above, however, has a pending problem in the plasma-doping process on a semiconductor device where precise control of the dose amount is required. Due to variations or errors in the dose amount, variations in semiconductor characteristics cannot be reduced. That is, the conventional methods have offered an insufficient consistency in correlation between the dose amount estimated from measurement of ions included in plasma and the dose amount in a semiconductor wafer after doping measured by secondary ion mass spectrometry (SIMS) or the like. Furthermore, SIMS is a destructive measurement where a part of a wafer has to be broken down, and therefore a sampling process is required in mass production.

The object of the present invention is to provide an impurity doping control method capable of controlling a dose amount of dopant with high accuracy and to provide an impurity doping apparatus.

DISCLOSURE OF THE INVENTION

The method of the present invention is to control an amount of dopant to be doped into an object to be processed in plasma doping. To achieve the object above, the impurity doping controlling method contains the following processes: determining the temperature of an object to be processed, an amount of ions having dopant in plasma that collide with the object to be processed, and types of gases in plasma during doping; calculating a dose amount doped into the object by neutral gas in the determined gases including dopant in plasma according to the temperature of the object; calculating a dose amount to be doped into the object by ions from the determined amount of ions containing dopant that collide with the object; and carrying out doping so that the sum of the dose amount by neutral gas and the dose amount by ions equal to a predetermined dose amount.

With the method above, gases included in plasma—not only ions that collide with an object to be processed—can be determined during the plasma-doping on the object to be processed. Besides, calculating the dose amount to be doped into an object to be processed by neutral gas selectively among the gases including dopant according to the temperature of the object can control the amount of dopant with higher accuracy compared to a conventional plasma-doping process. The gases include radicals and neutral gas.

As another structure of doping control on an object to be processed, the method of the present invention may contain the following processes: determining an amount of ions that collide with an object to be processed, types of gases containing dopant, and the amount of each type during doping; calculating the dose amount by neutral gas and the dose amount by ions at measurement according to the amount of ions, the gas types, and the amount of each gas type determined above; calculating difference between the sum of the dose amount by neutral gas and the dose amount by ions and a predetermined dose amount; and determining doping conditions for the remaining period after measurement of the doping process according to the difference obtained by the calculation.

As still another structure of doping control method of the present invention, the doping conditions may be defined by any one of electric power for generating plasma, bias power, pressure in a vacuum chamber, an amount of gas fed into the vacuum chamber, and a plasma-irradiating time on an object to be processed, or by a combination of them.

Besides, the gas types included in plasma can be determined by emission spectroscopy, mass spectroscopy, or both of them. The temperature of an object to be processed may be controlled at a given temperature not greater than 250° C.

With the methods above, necessary data can be measured during the doping process so as to feed back for controlling doping conditions for the post-measurement period of the doping process, thereby offering dopant control with high accuracy.

As another aspect of the present invention, according to the method of doping control on an object to be processed, dopant is added to the object by irradiation of dopant gas. The doping control method with the use of the irradiation of dopant gas contains the following process: measuring the temperature of an object to be processed; calculating a dose amount to be doped into the object by the dopant gas according to the temperature measured above: and carrying out doping under doping conditions determined in a manner that the calculated dose amount by the gas agrees with a predetermined dose amount. With the method above, dose-amount control with high accuracy in gas doping can be obtained.

In the method above, an object to be processed can be controlled at a temperature not greater than 20° C., not greater than 0° C., or not greater than −170° C. Controlling temperature of the object contributes to gas doping with accurately controlled and decreased dose amount of dopant.

The impurity doping apparatus of the present invention contains a doping mechanism for adding dopant to an object to be processed in plasma doping; a plasma controller for controlling generating conditions of plasma; a gas analyzer for determining ions and types of gases included in plasma during the doping process; a temperature-measuring instrument for measuring the temperature of the object; and a dose-amount controller for determining doping conditions by analyzing data obtained by the gas analyzer, the temperature-measuring instrument, and a predetermined dose amount. With the apparatus structured as above, doping is carried out under the defined doping conditions controlled by the plasma controller.

As another practicable doping control, the doping conditions may be defined by any one of electric power for generating plasma, bias power, pressure in a vacuum chamber, an amount of gas fed into the vacuum chamber, and a plasma-irradiating time on an object to be processed, or by a combination of them.

With such structured apparatus, gases included in plasma—not only ions that collide with an object to be processed—can be determined during the plasma-doping process on the object to be processed. Besides, calculating the dose amount to be doped into an object to be processed by neutral gas selectively among the gases including dopant according to the temperature of the object can control the amount of dopant with higher accuracy compared to a conventional device for controlling plasma doping.

The apparatus described above may contain a cooling mechanism for cooling an object to be processed or an electrode on which the object is disposed at a temperature not greater than 0° C. or not greater than −170° C. Having the structure above allows the apparatus to perform gas doping with further accurately controlled and decreased dose amount of dopant.

As another practicable structure, the impurity doping apparatus of the present invention contains a plasma-irradiating mechanism for generating and irradiating plasma on an object to be processed; a temperature controller for controlling the temperature of the object; a temperature-measuring instrument for measuring the temperature of the object; a dopant gas-feeding mechanism for applying dopant gas to the surface of the object after plasma irradiation; and a dose-amount calculator for determining a dose amount by dopant gas according to the temperature of the object obtained by the temperature-measuring instrument. In the apparatus structured above, doping is carried out under the temperature control of an object to be processed according to the dose amount to be doped into the object. The dose-amount calculator contains a storing means for storing data on the correlation between temperatures of an object to be processed and a dose amount to be doped in the object according to dopant gas. Besides, the plasma-irradiating mechanism can also cope with ion irradiation. In the structure above, the temperature controller may contain a cooling mechanism for cooling an object to be processed or an electrode on which the object is disposed at a temperature not greater than 0° C. or not greater than −170° C.

With the structure above, an object to be processed undergoes plasma irradiation having a gas with no dopant so as to have an amorphous state prior to gas doping with the use of dopant gas, so that the device performs gas doping with a decreased dose amount of dopant with highly accurate control.

A semiconductor device of the present invention is formed of a semiconductor substrate as an object to be processed, and the dopant is formed of an element that belongs to the third- or the fifth-family. Such structured dopant is applied to a predetermined region of the semiconductor substrate as an object to be processed by the doping method described above.

With the structure above, dopant can be applied with high accuracy to a predetermined section including a shallow-junction region of the semiconductor device. This allows a semiconductor device to have minimized variations in quality.

According to the method and apparatus of the present invention, the dose amount of dopant can be controlled with higher accuracy than before. The accurate doping control can extend coping range on semiconductor devices that have been thought to have difficulties in processing—due to the need for doping control with high accuracy—by a conventional method and apparatus. For example, not only an integrated circuit having single silicon crystal, but also a silicon-on-insulator (SOI) substrate, a strain silicon substrate, a compound semiconductor, active components, such as a thin film transistor that drives liquid crystal, and a biochip, can be employed. Furthermore, the present invention is applicable to passive components, such as a resistor, and surface modification of metal or the like.

DETAILED DESCRIPTION OF THE INVENTION

The method and device of doping control of an exemplary embodiment of the present invention are described hereinafter with reference to the accompanying drawings.

Here will be described the doping effect of gas that is not active or not ionized according to a dose amount in plasma doping.

Figure 1:
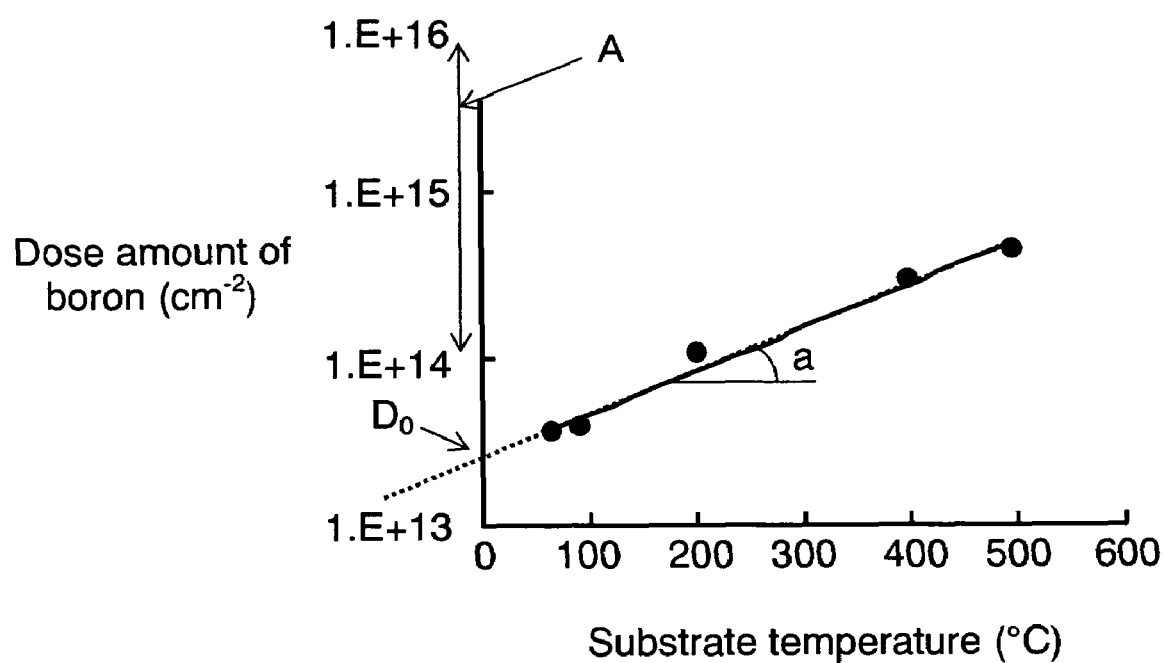
FIG. 1 is a graph showing a doping effect of gas including dopant corresponding to a dose amount in plasma doping.

FIG. 1 is a graph showing a doping effect of gas including dopant corresponding to a dose amount in plasma doping. In the graph, the horizontal axis represents surface temperatures of an object that undergoes doping, i.e., a substrate formed of single silicon crystal (hereinafter, a silicon substrate), and the vertical axis represents dose amounts of boron. The plasma doping was carried out under the following conditions: a silicon substrate disposed in a chamber undergoes argon (Ar)-plasma irradiation for 5 to 70 seconds with a bias voltage range of 70 to 200 V. Following the completion of the Ar-plasma irradiation, diborrane ($B_2H_6$) gas, which was diluted with helium (He) to have a concentration of 5%, is fed into the chamber for 5 to 70 seconds with pressure of 0.1 to 2.6 Pa. While the $B_2H_6$ gas is being fed, the surface temperature of the substrate was increased from 60° C. to 500° C.

Having $B_2H_6$-plasma irradiation in plasma doping, the surface of the silicon substrate varies its state from single crystal to amorphous because crystal disturbance occurs. Considering the well-known fact, we employed Ar as plasma gas in the doping process shown in FIG. 1 so as to just cause change in the surface of the silicon substrate. That is, irradiating $B_2H_6$-plasma on a silicon substrate causes not only change in the surface of the substrate but also boron doping, whereas Ar-plasma irradiation does not cause boron doping due to absence of boron in the plasma gas. Therefore, Ar-plasma irradiation tells that the substrate is doped by ions or by gas caused from the crystal disturbance of the substrate.

As described above, the silicon substrate undergoes Ar-plasma irradiation to change the surface into amorphous. Following the completion of Ar-plasma irradiation, $B_2H_6$ gas is fed into the chamber. The graph tells that the dose amount increases as the surface temperature increases. Furthermore, according to measurements with experimental conditions variously changed, we found that the dose amount was directly dependent on the surface temperature with no regard to the pressure level at $B_2H_6$-gas feeding or irradiation time of $B_2H_6$-gas. Unlike a typically observed doping, we estimate from the result that $B_2H_6$-gas, which is adsorbed onto the amorphous layer of the substrate, penetrates through the layer to inside, so that the doping occurs.

The dose amount of $B_2H_6$-gas increases in proportion to increase in surface temperatures of the silicon substrate, as shown in FIG. 1. The dose amount measured $3.5 \times 10^{13}$ cm$^{-2}$ at a surface temperature of 60° C., whereas the dose amount increased to $4.5 \times 10^{14}$ cm$^{-2}$ at a surface temperature of 500° C. When a substrate holder on which the silicon substrate sits is cooled so as to keep the substrate at room temperature, boron of approx. $3 \times 10^{13}$ cm$^{-2}$ is doped into the substrate by $B_2H_6$-gas that is not activated nor ionized.

In FIG. 1, range A shows the dose amount of boron needed for doping on source/drain extension. According to data described in FIG. 3-5-3 in Semiconductor Manufacturing Equipment Technical Roadmap 2001 published by SEAJ, range A of FIG. 1 ranges from approx. $1 \times 10^{14}$ cm$^{-2}$ to $1 \times 10^{15}$ cm$^{-2}$. Even in an estimation with an extended range so that sheet resistance of a semiconductor device meets the device requirements with reference to ITRS 2002 Update, the dose amount of $B_2H_6$-gas ranges from $1 \times 10^{14}$ cm$^{-2}$ to $1 \times 10^{16}$ cm$^{-2}$. In conventional plasma-doping, even when the silicon substrate is kept at room temperature, the dose amount of $B_2H_6$-gas measures approx. $3 \times 10^{13}$ cm$^{-2}$, which is equal to 0.3 to 30% of the dose amount in the extended estimation above: $1 \times 10^{14}$ cm$^{-2}$-$1 \times 10^{16}$ cm$^{-2}$. That is, unintended doping caused by gas that is not activated nor ionized hampers dose-amount control with high accuracy.

An effective way of suppressing the undesired effect of doping caused by such gases is to keep a silicon substrate in low temperatures. For example, cooling the substrate to -170° C. or lower (not shown in FIG. 1) can reduce the dose amount by gas to $1 \times 10^{13}$ cm$^{-2}$ or smaller. Therefore, when such an extremely cooled substrate undergoes plasma-doping, gas-doping also can reduce the dose amount to $1 \times 10^{13}$ cm$^{-2}$ or smaller. Even in plasma-doping on a substrate with a surface temperature of 0° C. or lower, the dose amount can be reduced to $3 \times 10^{13}$ cm$^{-2}$ or smaller. In this case, preferably a low dose-amount can be achieved without excessive load on a cooling device and therefore without increase in device costs. Decreasing the surface temperature below room temperature, i.e., at least lower than 20° C. certainly suppresses undesired doping by gas and, at the same time, further eases the load on a cooling device.

Furthermore, remaining the substrate temperature at a constant level from a time in the doping process until the completion of $B_2H_6$-gas feeding can control the dose amount by $B_2H_6$-gas itself. Therefore, not only determining the types of ions and the amount of ions in plasma-doping, but also keeping the substrate temperature at a constant level can achieve preferable dose-amount control with high accuracy. In contrast, keeping the dose amount by ions at a constant level; meanwhile, changing the substrate temperature can also control the dose amount. Furthermore, controlling both of the dose amount by ions and the substrate temperature can offer the dose amount with high accuracy.

The description given hereinafter is a surmise on the process of the doping by $B_2H_6$-gas. It is believed that a dose amount to be doped into a silicon substrate is almost subject to the amount of ions that collide with the substrate, gas types, and interaction between gas and the surface with crystal disturbance—due to plasma irradiation—of the silicon substrate. For instance, in the process of forming $B_2H_6$ into plasma-gas with a silicon substrate as the cathode, ions containing boron, which are formed through ionization in a plasma sheath, accelerate and collide with the silicon substrate to be dopant. The amount of boron to be doped depends on the amount and type of boron-including ions that collide with the substrate.

When ions collide with the silicon substrate, a crystal lattice of the substrate is disturbed by impact of the collision, so that the crystal surface changes into an amorphous state and has a dangling bond. When a neutral gas containing boron contacts with the amorphous surface, boron is taken into the dangling bond. It is believed that, through the process above, boron is doped into the substrate as dopant.

To realize a proper doping control based on the estimation above, the impurity doping apparatus of the present invention contains a doping mechanism for adding dopant to an object to be processed in plasma doping; a plasma controller for controlling generating conditions of plasma; a gas analyzer for determining ions and types of gases included in plasma during the doping process; a temperature-measuring instrument for measuring the temperature of the object; and a dose-amount controller for determining doping conditions by analyzing data obtained by the gas analyzer, the temperature-measuring instrument, and a predetermined dose amount. With the apparatus structured above, doping is carried out under the defined doping conditions controlled by the plasma controller. In the structure above, the gas analyzer—formed of an emission spectrometer or a mass spectrometer—determines the types of gases, and the temperature-measuring instrument measures the temperature of an object to be processed. A dose amount to be doped by neutral gas is obtained according to the temperature of the object; at the same time, a dose amount that has been already doped into the object is defined from the amount of ions that collide with the object.

The dose-amount controller analyzes these amounts and a predetermined dose amount and determines doping conditions, under which doping is carried out.

Figure 2:
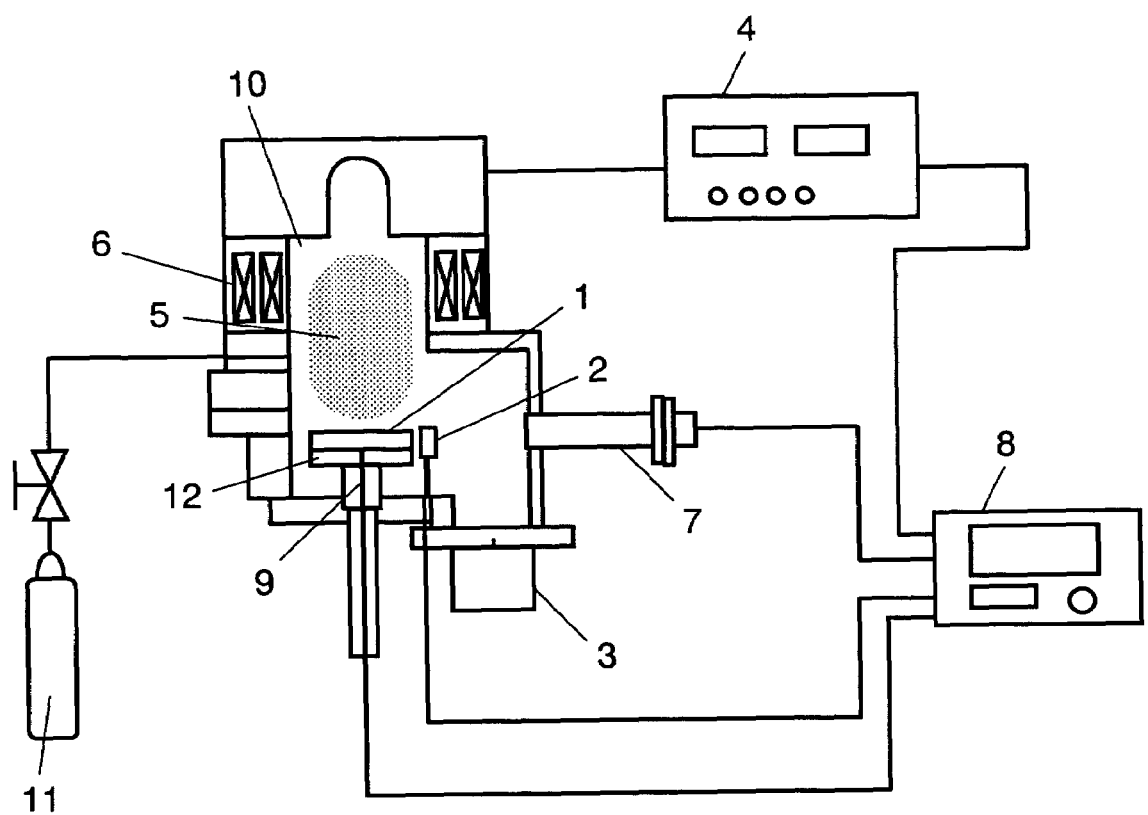
FIG. 2 schematically shows a structure of the doping control device of an exemplary embodiment of the present invention.

FIG. 2 schematically shows a structure of the doping control device of an exemplary embodiment of the present invention. Vacuum chamber 10 is evacuated by vacuum pump 3, such as a turbo-molecular pump. Vacuum chamber 10 has holder 12 on which object 1 to be processed is held. Holder 12 and object 1 maintain good heat transfer therebetween. Application of high-frequency power from plasma controller 4 generates plasma 5 above object 1. Plasma 5 is, namely, $B_2H_6$-plasma. $B_2H_6$-gas as a source is fed from gas bomb 11.

Magnets 6, which are fixed around vacuum chamber 10, concentrate plasma 5 in the center to maintain sufficient density. Ions in plasma 5 are attracted by an electric field created by the application of bias voltage to holder 12, and collide against the surface of object 1. Through the collision, dopant (that depends on ions contained in plasma 5; in this case, boron) is doped into object 1.

Ion analyzer 2, such as a Faraday cup, is disposed adjacent to object 1. Ion analyzer 2 detects ions that collide with object 1 and outputs an electric signal having data on the amount of ions to dose-amount controller 8. Dose-amount controller 8 stores the following data: a total amount of dopant to be doped; temperature data of object 1 fed from temperature sensor 9 as a temperature-measuring instrument; and analysis data on gas adjacent to object 1 that is fed from gas analyzer 7, such as a mass spectrometer. Analyzing those data above, dose-amount controller 8 determines a dose amount at the time and calculates a difference between the calculated dose amount and a predetermined dose amount, and then sends a data signal on the difference to plasma controller 4. According to the data, plasma controller 4 controls various parameters—pressure of vacuum chamber 10; mixing ratio and density of gas; plasma-irradiating time; high-frequency power; and bias voltage, and continues the doping process. Changing the parameters above can control the types of ions and the amount of ions toward object 1, thereby controlling the dose amount of dopant with high accuracy.

In the doping process above, keeping the temperature of object 1 at a constant level simplifies the calculation to obtain a difference between a calculated dose amount and a predetermined dose amount.

Although mass spectrometer 7 is employed for a gas analyzer of plasma in the embodiment, it is not limited thereto; an emission spectrometer can be used as a monitor. Besides, the temperature of an object to be processed can be controlled by dose-amount controller 8 or by an additionally disposed controller.

As described above, the impurity doping apparatus of the present invention monitors the temperature of an object to be processed; determines a dose amount to be doped by gas according to the temperature; calculates a difference between the obtained dose amount above and a predetermined dose amount; and defines parameters for plasma doping according to the calculated difference. In this way, the impurity doping apparatus offers a highly accurate control on the dose amount to be doped into an object. When the temperature of an object is controlled, a target amount of dopant can be added to the object by gas-doping only. The doping control above is highly effective in the doping process of a silicon substrate that demands dose-amount control with high accuracy in a shallow dopant-region. Furthermore, the impurity doping apparatus of the present invention controls the dose amount while monitoring the parameters in the doping process, thereby increasing mass-productivity and raising the yield.

For gas-doping only, the structure of the apparatus shown in FIG. 2 can be modified. In that case, the impurity doping apparatus may contain a plasma-irradiating mechanism for generating and irradiating plasma, prior to gas doping, on an object to be processed; a temperature controller for controlling the temperature of the object; a temperature-measuring instrument for measuring the temperature of the object; a dopant gas-feeding mechanism for applying dopant gas to the surface of the object after plasma irradiation; and a dose-amount calculator for determining a dose amount according to the temperature of the object obtained by the temperature-measuring instrument. The dose-amount calculator may contain a storing means for storing data on the correlation between temperatures of an object to be processed and a dose amount to be doped in the object according to dopant gas. Besides, the plasma-irradiating mechanism may be responsible for ion irradiation.

With the apparatus structured as above, an object to be processed undergoes plasma irradiation to have an amorphous surface prior to gas doping. After that, the amorphous surface is exposed to dopant gas, whereby a dose amount according to the temperature of the object is doped into the object with high accuracy.

As an object to be processed, not only a silicon substrate, but also a compound semiconductor, a substrate for forming an active component, such as a thin film transistor that drives liquid crystal, and a biochip, can be employed.

Hereinafter will be given specific description of exemplary embodiments.

First Exemplary Embodiment

The description given in connection with this embodiment is about results of gas-doping in which boron was doped into a silicon substrate. In the experiment, a silicon substrate disposed in a chamber underwent helium (He)-plasma irradiation for 20 seconds. Following the completion of the He-plasma irradiation, diborrane ($B_2H_6$) gas, which was diluted with helium (He) to have concentration of 5%, was fed into the chamber for 7 seconds with pressure of 1 Pa. While the $B_2H_6$ gas was being fed, the surface temperature of the substrate was increased from 60° C. to 500° C. According to the gas-doping through the process above, the relationship between the dose amount of boron and the substrate temperature is similar to that shown in FIG. 1. The relationship between the dose amount of boron (Dgas) and the substrate temperature (T) is expressed by equation (1):

$$D\text{gas} = D_0 \cdot \exp(a \cdot T) \quad (1),$$

where, Dgas represents the dose amount (cm-2) of boron; $D_0$ represents the dose amount ($cm^{-2}$) of boron at the substrate temperature of 0° C. (i.e., 273 K); a represents changes in the dose amount of boron as the substrate temperature changes, that is, shows gradients in FIG. 1; and T represents the substrate temperature (° C.).

In the aforementioned gas-doping using boron as dopant, the dose amount was determined under the control of the substrate temperature, that is, to obtain desired Dgas, T was changed on equation (1). According to FIG. 1, the substrate temperature at which a dose amount of $1 \times 10^{13}$ $cm^{-2}$ can be obtained is −170° C. After the silicon substrate in the chamber underwent helium (He)-plasma irradiation for 20 seconds, the substrate temperature was set at −170° C. Following the completion of He-plasma irradiation, diborrane ($B_2H_6$) gas, which was diluted with helium to have concentration of 5%, was fed into the chamber for 30 seconds with pressure of 1 Pa.

FIG. 1 tells that setting substrate temperature at 0° C. can obtain a dose amount of $3 \times 10^{13}$ cm$^{-2}$; similarly, setting the temperature at 100° C. can obtain a dose amount of $5 \times 10^{13}$ cm$^{-2}$. Furthermore, setting the temperature at 240° C.—if it is possible in a case where types of photoresist or other processes are taken into account—can obtain a dose amount of $1 \times 10^{14}$ cm$^{-2}$. Equation (1) is adaptable for different types of substrates and gasses; even when experiments employ different substrates and gasses, equation (1) always can tell proper values of $D_0$ and a for each substrate and gas.

In this way, by controlling the substrate temperature, the dose amount can be determined in the gas-doping using boron as dopant.

On the other hand, a boron-doped silicon substrate was prepared as a comparative sample through the following process. The silicon substrate in the chamber underwent helium (He)-plasma irradiation for 20 seconds. Following the completion of He-plasma irradiation, diborrane (B$_2$H$_6$) gas, which was diluted with helium to have concentration of 5%, was fed into the chamber for 7 seconds with pressure of 1 Pa. The surface temperature of the substrate was set at 0° C. during the gas feeding.

According to the doping conditions above, the substrate has no diborrane (B$_2$H$_6$)-gas plasma irradiation. The dose amount of boron estimated by Faraday cup as ion analyzer 2 measures $1 \times 10^{11}$ cm$^{-2}$, which means that the amount of boron doped into the substrate is negligible. However, the SIMS measurement after the B$_2$H$_6$-gas doping showed that $3 \times 10^{13}$ cm$^{-2}$ boron was detected from the silicon substrate. The detected dose amount exceeds the estimated dose amount by more than two digits. This fact shows that a highly accurate gas doping cannot be obtained as long as the effect of the gas-doping is taken into account as is done in the embodiment.

Gas-doping is a dopant-doping method having the following processes; silicon substrate 1 undergoes plasma irradiation in vacuum chamber 10 to have an amorphous surface, (i.e., to make an amorphous state by plasma irradiation). Following the completion of the plasma irradiation, boron-containing gas, for example, diborrane-gas is fed into vacuum chamber 10. Making an amorphous state by plasma irradiation is a process in which a principal surface of a solid substrate, for example, a silicon substrate undergoes plasma irradiation to have an amorphous surface. Gas-doping is an extremely low-energy doping method, making a good use of the phenomenon that gas easily permeates through an amorphous layer. Specifically, after a surface of a semiconductor including silicon is changed into an amorphous state, the amorphous surface is exposed to gas containing desired dopant, for example, B$_2$H$_6$ so that particles containing dopant permeate through the surface. As a result, desired dopant is doped into the semiconductor. The device of the present invention may separately handle with the process above: one is for making an amorphous surface, and the other is for exposing the amorphous surface to dopant-containing gas. For example, the apparatus may have two vacuum chambers A and B. In this case, after a silicon substrate undergoes plasma irradiation to attain an amorphous surface in vacuum chamber A, the substrate is carried into vacuum chamber B to undergo B$_2$H$_6$-gas doping. Preferably, using a transfer chamber between the chambers A and B so as to move the substrate in a vacuum is as effective as being processed in a single chamber. Although the present invention employs plasma irradiation as a method of making an amorphous surface, ion implantation of Ge or Si can be used. In this case, a silicon substrate undergoes ion implantation of Ge or Si to attain an amorphous surface, and then the substrate is carried into vacuum chamber 10 to undergo B$_2$H$_6$-gas doping. Furthermore, irradiating the substrate with electron rays or radioactive rays is also effective.

Second Exemplary Embodiment

The description given in connection with this embodiment is about results of plasma-doping in which a dose amount of boron of $3.5 \times 10^{14}$ cm$^{-2}$ was doped into a silicon substrate. In the experiment, a silicon substrate disposed in a chamber underwent diborrane (B$_2$H$_6$)-plasma irradiation for 7 seconds. In the plasma irradiation, the B$_2$H$_6$-gas, which was diluted with helium (He) to have concentration of 0.025%, was fed into the chamber with pressure of 0.9 Pa. While the B$_2$H$_6$-gas was being fed, a bias voltage of 100V—biased by 600 kHz-high frequency power supply—was applied to the silicon substrate. The source power was set at 1500 W. The surface temperature of the substrate was kept at 0° C.

In this case, an amount of B$_2$H$_6$-gas, which is estimated by gas analyzer 7 under a substrate temperature of 0° C., measures $3 \times 10^{13}$ cm$^{-2}$. According to Faraday cup as ion analyzer 2, the estimated dose amount measures $3.2 \times 10^{14}$ cm$^{-2}$. On the other hand, the SIMS (Secondary Ion Mass Spectrometry) measurement after the plasma-doping showed that $3.5 \times 10^{14}$ cm$^{-2}$ boron was detected from the silicon substrate. The result proves that the method of this embodiment can control the dose amount with high accuracy.

On the other hand, a boron-doped silicon substrate was prepared by plasma-doping as a comparative sample. A target dose amount is $3.5 \times 10^{14}$ cm$^{-2}$. After the silicon substrate was placed in the chamber, diborrane (B$_2$H$_6$) gas, which was diluted with helium (He) to have concentration of 0.025%, was fed into the chamber with pressure of 0.9 Pa, and plasma was generated. During plasma irradiation, a bias voltage of 100V—biased by 600 kHz-high frequency power supply— was applied to the silicon substrate. The source power was set at 1500 W. The surface temperature of the substrate was kept at 0° C.

In the comparative experiment, plasma irradiation was stopped, with the effect of the gas-doping disregarded, when the estimated dose amount measured by Faraday cup as ion analyzer 2 reached $3.5 \times 10^{14}$ cm$^{-2}$. The SIMS measurement after the doping detected a dose amount of boron of $3.8 \times 10^{14}$ cm$^{-2}$, which was 9% larger than the target dose amount. The result proves that a highly accurate gas doping cannot be obtained unless the effect of the gas-doping is taken into account.

Third Exemplary Embodiment

In the third embodiment, like the previous embodiment, boron is doped into a silicon substrate by plasma-doping. The target dose amount is $3.5 \times 10^{14}$ cm$^{-2}$. In the experiment, a silicon substrate disposed in a chamber underwent diborrane (B$_2$H$_6$)-plasma irradiation for 60 seconds. In the plasma irradiation, the B$_2$H$_6$-gas, which was diluted with helium (He) to have concentration of 0.025%, was fed into the chamber with pressure of 0.9 Pa. While the B$_2$H$_6$-gas was being fed, a bias voltage of 100V—biased by 600 kHz-high frequency power supply—was applied to the silicon substrate. The source power was set at 1500 W. The surface temperature of the substrate was kept at 0° C. The doping conditions of the embodiment are the same as those of the second embodiment, except for the plasma-irradiating time.

In this case, an amount of B$_2$H$_6$-gas, which is estimated by gas analyzer 7 under a substrate temperature of 0° C., measures $3 \times 10^{13}$ cm$^{-2}$. The dose amount by gas is, as described above, not subject to plasma-irradiating time. According to the Faraday cup as ion analyzer 2, the estimated dose amount measures $9.7 \times 10^{14}$ cm$^{-2}$. In contrast, the SIMS measurement after the plasma-doping showed that $1.0 \times 10^{15}$ cm$^{-2}$ boron was detected from the silicon substrate. The result proves that the method of this embodiment can control the dose amount with high accuracy.

Fourth Exemplary Embodiment

In the fourth embodiment, like the previous embodiment, boron is doped into a silicon substrate by plasma-doping; particularly, the description given in connection with this embodiment is about a method capable of controlling the dose amount with high accuracy even when the substrate temperature cannot be constantly maintained in doping two or more substrates.

The target dose amount is $3.5 \times 10^{14}$ cm$^{-2}$. A silicon substrate disposed in a chamber underwent diborane ($B_2H_6$)-plasma irradiation for t seconds. In the plasma irradiation, the $B_2H_6$-gas, which was diluted with helium (He) to have concentration of 0.025%, was fed into the chamber with pressure of 0.9 Pa. While the $B_2H_6$-gas was being fed, a bias voltage of 100V—biased by 600 kHz-high frequency power supply—was applied to the silicon substrate. The source power was set at 1500 W. Under the conditions above, the doping process was repeated to complete 500 silicon substrates.

The description here will be given on the basis of the following supposition; the first substrate temperature just before the start of the process is T ° C., and the n$^{th}$ surface temperature just before the start of the process varies to T+$\Delta$T(n) ° C., since being affected by changes in temperatures of cooling water, of the inside of the chamber caused by plasma irradiation. Usually, $\Delta$T(n) is considered to take a positive value because the temperature of the n$^{th}$ substrate is likely to be higher than that of the temperature of the first substrate. However, $\Delta$T(n) can be negative according to the temperature setting of cooling water or changes in the cooling water itself. Furthermore, $\Delta$T can be controlled at 0° C. Controlling temperatures of cooling water so that the substrate temperature is kept constant (i.e., $\Delta$T equal to 0° C.) takes a long time until $\Delta$T settles to 0° C., resulting in lowered throughput.

To address the inconvenience above, we corrected equation (1) so that the effect of the dose amount by gas is taken into calculation. The dose amount by the B2H6-gas, which is estimated by gas analyzer 7 and a substrate temperature of T+$\Delta$T(n) ° C., is represented by the equation below:

$$D\text{gas}(n) = D_0 \cdot \exp(a \cdot T + \Delta T(n)),$$

where, Dgas (n) represents the dose amount by the $B_2H_6$-gas to be doped into the n$^{th}$ silicon substrate; $D_0$ and a varies according to measurement of gas analyzer 7, types and amounts of gases and radicals.

Now suppose that a dose amount estimated by the Faraday cup as ion analyzer 2 after t-second plasma-doping measures Dion (t) cm-2. Total dose amount D of boron to be doped into the n$^{th}$ silicon substrate is represented as the sum of the dose amount by gas represented by Dgas(n) and the dose amount by ions represented by Dion (t) as follows:

$$D = Dion(t) + Dgas(n)$$
$$= Dion(t) + D_0 \cdot \exp(a \cdot T + \Delta T(n)).$$

The equation shows that controlling plasma-irradiating time t according to $\Delta$T(n) can obtain desired D when $\Delta$T(n) varies in the repeatedly performed doping process. That is, even when the surface temperature of the n$^{th}$ silicon substrate just before the start of doping gets higher, desired D can be obtained by shortened plasma-irradiating time t. Controlling the plasma-irradiating time according to changes in substrate temperature allows the doping process to go on without waiting for a constant substrate temperature, thereby offering an accurately controlled dose amount, with high throughput maintained.

Although the plasma-irradiating time is flexibly determined according to changes in $\Delta$T(n), it is not limited thereto; other parameters—pressure at plasma-doping, concentration of $B_2H_6$-gas, or source power—may be changed for obtaining a desired dose amount. For example, when the temperature of the n$^{th}$ silicon substrate just before the start of doping is higher than that of the (n−1)$^{th}$ silicon substrate just before the start of doping, determining the concentration of $B_2H_6$-gas used for doping the n$^{th}$ silicon substrate to be lower than that for doping the (n−1)$^{th}$ silicon substrate is similarly effective. In this way, by controlling a predetermined parameter according to changes in $\Delta$T(n) just before or during each process, dose-amount control with high accuracy can be obtained.

Fifth Exemplary Embodiment

The description given in connection with this embodiment is of a process in which boron is doped into a silicon substrate with the temperature maintained low. A silicon substrate disposed in a chamber underwent diborane ($B_2H_6$)-plasma irradiation for 7 seconds. In the plasma irradiation, the $B_2H_6$-gas, which was diluted with helium (He) to have concentration of 0.001%, was fed into the chamber with pressure of 0.9 Pa. That is, the concentration of $B_2H_6$-gas was determined to be extremely low in the experiment. While plasma was being generated, a bias voltage of 100V—biased by 600 kHz-high frequency power supply—was applied to the silicon substrate; the source power was set at 1500 W; and the substrate temperature was maintained at −170° C.

According to the result of SIMS measurement, the dose amount of boron was $1.5 \times 10^{13}$ cm$^{-2}$. A doping process in which the substrate is kept at room temperature cannot achieve that low amount. In plasma doping on a substrate kept at room temperature, not only ions, but also gases permeate through the surface of the substrate. Therefore, boron of approx. $1 \times 10^{14}$ cm$^{-2}$ is easily doped into the substrate through only plasma irradiation. Of the aforementioned dose amount, an amount of $4 \times 10^{13}$ cm$^{-2}$ is doped by adsorption and permeation of gas, as is seen in FIG. 1. The inconvenience above has been an obstacle to achieving a dose amount not greater than $1 \times 10^{14}$ cm$^{-2}$ in the plasma doping repeatedly performed on semiconductor substrates at room temperature. In contrast, the plasma doping performed on temperature-cooled substrates can achieve a low dose amount.

Although diborane ($B_2H_6$) is used as doping gas in the embodiments of the present invention, it is not limited thereto; gases of hydrogen compound containing, for example, $B_4H_{10}$, $B_5H_9$, $B_5H_{11}$, $B_6H_{10}$, $B_{10}H_{14}$ can be employed, instead of $B_2H_6$. Gases of hydrogen compound containing boron are most suitable for doping gas; they have low etching rates to a silicon substrate, so that silicon substrates are practically not etched through plasma irradiation. As another usable gas, gases of fluoride containing boron include $BF_3$ and $B_2F_4$. As still another usable gas, gases of chloride containing boron include $B_2Cl_4$ and $BCl_3$. Furthermore, solid elements can be employed. In this case, any one of BI$_3$, BBr$_3$, B$_2$O$_3$, B$_2$S$_3$, and BN, or a mixture of them can be processed into ionized gas to obtain doping gas.

INDUSTRIAL APPLICABILITY

The doping control method of the present invention can control a dose amount of dopant during plasma doping, thereby achieving doping control with high accuracy, at the same time, enhancing mass productivity of the doping process. It is therefore useful for manufacturing a silicon semiconductor device and a thin film transistor (TFT) that drives liquid crystal because they need a highly accurate control of a dose amount to have a shallow junction.

The invention claimed is:

1. A method of controlling an introduction of impurities, comprising:
   (a) installing a processing object in a chamber; and
   (b) introducing the impurities of a desired dose amount to the processing object, by exposing the processing object to a plasma using a gas containing the impurities provided in the chamber after said installing of the processing object,
   wherein a temperature of the processing object is suppressed such that a sum of a first dose amount at which the impurities in the gas containing the impurities existing in the plasma are introduced to the processing object and a second dose amount at which the impurities ionized by the plasma are introduced to the processing object comes to a desired dose amount.

2. The method according to claim 1, wherein said introducing of the impurities includes making a surface of the processing object amorphous by the plasma and the impurities of the first dose amount are introduced, by contacting the gas containing the impurities to the surface of the processing object made amorphous.

3. The method according to claim 1, wherein the gas containing the impurities existing in the plasma is not activated or ionized.

4. The method according to claim 1, wherein the first dose amount increases as a temperature of the processing object rises.

5. The method according to claim 1, wherein the temperature of the processing object is evaluated from data representing a relation between the temperature of the processing object and the dose amount of the impurities introduced to the processing object from the gas containing the impurities and the temperature of the processing object.

6. The method according to claim 1, wherein the temperature of the processing object is controlled at any set temperature of 250° C. or less.

7. The method according to claim 1, wherein the temperature of the processing object is controlled at any set temperature less than 20° C.

8. The method according to claim 1, wherein the temperature of the processing object is controlled at any set temperature of 0° C. or less.

9. The method according to claim 1, wherein the temperature of the processing object is controlled at any set temperature of −170° C. or less.

10. The method according to claim 1, wherein the gas containing the impurities is a gas containing boron.

11. The method according to claim 1, wherein the gas containing the impurities is a hydrogen compound gas containing boron.

12. The method according to claim 1, wherein the gas containing the impurities is a diborane gas diluted with helium.

13. The method according to claim 1, wherein the processing object is a silicon substrate.

14. The method according to claim 1, wherein the first dose amount is in the range of 0.3 to 30% of the desired dose amount.

15. The method of controlling an introduction of impurities, comprising:
   (a) making a surface of a processing object amorphous;
   (b) setting the processing object to a desired temperature; and
   (c) irradiating a gas containing the impurities to the processing object of which the surface is made amorphous and introducing the impurities of a desired dose amount to the processing object after said making of the surface of the processing object amorphous and said setting of the processing object to the desired temperature;
   wherein the desired temperature is a temperature at which a dose amount of the impurities introduced from the gas containing the impurities becomes the desired dose amount; and
   wherein the impurities of the desired dose amount are introduced by contacting the gas containing the impurities to the surface of the processing object made amorphous in said irradiating of the gas containing the impurities.

16. The method according to claim 15, wherein the impurities of the desired dose amount are introduced by contacting the gas containing the impurities to the surface of the processing object made amorphous in said irradiating of the gas containing the impurities.

17. The method according to claim 15, wherein a surface of the processing object is made amorphous by a plasma process using a gas not containing the impurities.

18. The method according to claim 15, wherein the temperature of the processing object is controlled at any set temperature of 250° C. or less.

19. The method according to claim 15, wherein the temperature of the processing object is controlled at any set temperature less than 20° C.

20. The method according to claim 15, wherein the temperature of the processing object is controlled at any set temperature of 0° C. or less.

21. The method according to claim 15, wherein the temperature of the processing object is controlled at any set temperature of −170° C. or less.

22. The method according to claim 15, wherein the gas containing the impurities is a gas containing boron.

23. The method according to claim 15, wherein the gas containing the impurities is a hydrogen compound gas containing boron.

24. The method according to claim 15, wherein the gas containing the impurities is a diborane gas diluted with helium.

25. The method according to claim 15, wherein the processing object is a silicon substrate.

* * * * *